(12) United States Patent
Rodegheri et al.

(10) Patent No.: US 10,682,845 B2
(45) Date of Patent: Jun. 16, 2020

(54) FILM TRANSDUCER

(71) Applicant: Buerkert Werke GmbH, Ingelfingen (DE)

(72) Inventors: Cricia De Carvalho Rodegheri, Mainz (DE); Marcel Konstandin, Karlsruhe (DE); Peter Krippner, Karlsruhe (DE); Stefan Seelecke, Saarbruecken (DE); Marc Hill, Gersheim (DE)

(73) Assignee: BUERKERT WERKE GMBH (DE)

( * ) Notice: Subject to any disclaimer, the term of this patent is extended or adjusted under 35 U.S.C. 154(b) by 248 days.

(21) Appl. No.: 15/228,197

(22) Filed: Aug. 4, 2016

(65) Prior Publication Data
US 2017/0047503 A1 Feb. 16, 2017

(30) Foreign Application Priority Data

Aug. 10, 2015 (DE) .......................... 10 2015 113 163

(51) Int. Cl.
| | | |
|---|---|---|
| *H01L 41/053* | (2006.01) | |
| *H01L 41/09* | (2006.01) | |
| *H01L 41/113* | (2006.01) | |
| *B33Y 80/00* | (2015.01) | |
| *B33Y 50/00* | (2015.01) | |

(52) U.S. Cl.
CPC .............. *B33Y 80/00* (2014.12); *B33Y 50/00* (2014.12); *H01L 41/053* (2013.01); *H01L 41/0986* (2013.01); *H01L 41/113* (2013.01)

(58) Field of Classification Search
CPC ... H01L 41/053; H01L 41/0986; H01L 41/113
USPC .......................... 310/328, 330–332, 338, 339
See application file for complete search history.

(56) References Cited

U.S. PATENT DOCUMENTS

| | | | | |
|---|---|---|---|---|
| 4,952,836 A | * | 8/1990 | Robertson | ........... H01L 41/1136 |
| | | | | 310/330 |
| 6,392,329 B1 | | 5/2002 | Bryant et al. | |
| 6,698,072 B1 | * | 3/2004 | Stier | ................... H01L 41/0835 |
| | | | | 29/25.35 |
| 8,450,909 B2 | * | 5/2013 | Lee | ......................... H02N 2/18 |
| | | | | 310/339 |

(Continued)

FOREIGN PATENT DOCUMENTS

| | | |
|---|---|---|
| CN | 103563236 A | 2/2014 |
| EP | 1724849 A2 | 11/2006 |

(Continued)

OTHER PUBLICATIONS

German Search Report dated Jul. 12, 2016 from corresponding German Application No. 10 2015 113 163.3, along with unofficial English translation, 7 pages.

(Continued)

*Primary Examiner* — Derek J Rosenau
(74) *Attorney, Agent, or Firm* — Dilworth IP, LLC (57) ABSTRACT

A film transducer has a holding part, an electroactive composite structure which includes at least one deformable carrier and at least two electrodes arranged on opposite sides of the deformable carrier, and a load application member which is mounted to the composite structure. The holding part engages two ends of the composite structure facing away from each other and the load application member is arranged between the two ends of the composite structure.

38 Claims, 6 Drawing Sheets

(56) References Cited

U.S. PATENT DOCUMENTS

| | | | |
|---|---|---|---|
| 2002/0140321 A1 | 10/2002 | Waterfield | |
| 2002/0175598 A1* | 11/2002 | Heim | H01L 41/0986 |
| | | | 310/328 |
| 2003/0122448 A1 | 7/2003 | Kim et al. | |
| 2005/0258715 A1* | 11/2005 | Schlabach | H01L 41/0926 |
| | | | 310/331 |
| 2006/0159295 A1* | 7/2006 | Onishi | H04R 17/00 |
| | | | 381/190 |
| 2007/0200468 A1* | 8/2007 | Heim | F04B 43/0054 |
| | | | 310/311 |
| 2011/0248605 A1 | 10/2011 | Lee et al. | |
| 2012/0032559 A1* | 2/2012 | Hino | H01L 41/047 |
| | | | 310/331 |
| 2012/0235543 A1* | 9/2012 | Suda | F03G 7/005 |
| | | | 310/363 |
| 2014/0145550 A1 | 5/2014 | Hitchcock et al. | |
| 2015/0207436 A1 | 7/2015 | Lee et al. | |

FOREIGN PATENT DOCUMENTS

| | | |
|---|---|---|
| TW | 201136128 A | 10/2011 |
| WO | 2007100606 A2 | 9/2007 |

OTHER PUBLICATIONS

"Plated and Non-Plated Trough Holes"; Retrieved from: www.pcbunlimited.com; Date published: Mar. 10, 2019; Date retrieved: Oct. 9, 2019.

\* cited by examiner

FILM TRANSDUCER

FIELD OF THE INVENTION

The invention relates to a film transducer.

BACKGROUND OF THE INVENTION

The film transducer can be used for converting electrical energy to mechanical work. It is, for example, known to utilize it as an actuator.

A conventional design of such film transducer uses a holding part, an electroactive composite structure including at least one deformable carrier and at least two electrodes arranged on opposite sides of the deformable carrier, and a load application member mounted to the electroactive composite structure.

In simplified terms, the electroactive composite structure consists of an elastically deformable dielectric medium in the form of a thin film which serves as a carrier for the two electrodes. The electrodes are mounted to the upper and lower sides of the film. When an electric field is generated between the two electrodes, an attractive force is produced between the electrodes, so that they seek to reduce the distance between them. This causes the carrier to be pressed together. Since the material of the carrier is essentially incompressible, a reduction in thickness of the carrier results in an increase in its length. This may generate a stroke of the load application member, for instance when it is urged into a specific direction by a spring.

In the prior art, the holding part is usually in the form of a closed ring or frame enclosing the composite structure on all sides. In a top view, for example, this frame and the carrier may have a circular shape or a rectangular shape. It has been found that this is not an optimum shape for the holding part for various applications.

It is the object of the invention to improve the known film transducer in such a way as to produce a better adjustment behavior of the load application member.

SUMMARY OF THE INVENTION

To achieve this object, provision is made in a film transducer of the kind mentioned at the outset that the holding part engages two ends of the composite structure facing away from each other and the load application member is arranged between the two ends of the composite structure. The invention is based on the fundamental idea of no longer clamping the composite structure in the holding part on all sides, but, in general terms, of using a strip-shaped composite part which is fixed in place on its opposite ends by the holding part. This results in a longer free stretch or way of the composite structure that can be converted to a stroke of a load application member. This is due to the fact that when the composite structure is only held at its opposite ends, it will mainly deform along its longitudinal axis, that is, primarily in one direction. A further advantage resides in that the film transducer is suitable for applications where only a narrow space is available.

The composite structure preferably has a rectangular basic shape. "Rectangular" in this connection more specifically means that there are two longer side edges and two shorter side edges. Preferably, the length of the longer side edges is at least twice the length of the shorter side edges. "Rectangular" does not necessarily mean that it is mandatory for the composite structure to have straight side edges and/or corners. The composite structure may have a "boat shape", a kidney shape, etc.

The composite structure may basically consist of one single deformable carrier which is provided with two electrodes on opposite sides. But it is also possible for the composite structure to include two or more deformable carriers, between which electrodes are arranged in a suitable manner. In this way, the mechanical or electrical power provided by the film transducer can be increased.

If a plurality of deformable carriers is provided, the electrodes are preferably plated through in the area of the holding part. This allows a plurality of electrodes to be connected at the same time using one single contact.

The carrier preferably is a dielectric material, in particular a dielectric polymer. An electroactive polymer is particularly preferred. Basically, the carrier may be a sheet or a film, for example made from a polymer, e.g., from silicone, an acrylate or PU.

A variety of processes may be used for producing the carrier. It is particularly preferred to configure the carrier as a printed component which has been produced more particularly by a screen printing process, a pad printing process or a 3D printing process.

The dielectric may also be a cast component which has been produced as a spin coating, for example.

The electrodes may consist of a matrix material, a conductive material, solvents and additives. In this way, the desired high deformability can be obtained, accompanied by a good electrical conductivity.

An elastomer material, for example silicone, acrylate or PU, is more particularly suitable for the matrix material.

For the conductive material of the electrodes, soot, carbon nanotubes, conductive polymers, nanowires or a mixture of these materials may be used. These materials ensure that the electrical conductivity of the electrodes is maintained even over a large number of deformation cycles and that a mechanical deformation of the dielectric is not affected.

The electrodes may be configured as a printed component. In particular, a screen printing process, a pad printing process, a 3D printing process, a laminating process, an inkjet printing process or an aerosol jet process are suitable therefor. These processes allow the electrodes to be directly produced on the carrier.

The electrodes may also be produced separately and be bonded to the carrier.

According to one configuration, provision is made that the electrode is configured to be continuous on one side of the carrier. As an alternative, it is also possible that the electrode consists of two separate electrode sections on one side of the carrier, which, upon an actuation, are at the same potential.

With a view to an optimum stroke of the load application member, it is provided for that the composite structure has an elongated, rectangular basic shape and the holding part engages the two shorter sides of the composite structure.

According to one configuration of the invention, provision is made that the holding part consists of two fixing sections each of which is arranged at one end of the composite structure. These fixing sections need not necessarily be firmly connected with each other, but may be mounted to a basic element, so that the composite structure is suitably held between them. In other words, the fixing sections are connected to each other only indirectly by means of the composite structure.

Preferably, the fixing sections are provided with fastening openings here. This makes it easier to fasten the fixing sections to a basic element. In particular, the fastening openings may also be used for the contacting.

The two fixing sections may also be connected to each other by connecting sections. In this way, a frame-type holding element is formed as the basic shape, which, however, is connected to the composite structure only on two sides facing away from each other, whereas the composite structure is spaced apart from the two connecting sections on the other two (the longer) sides.

Predetermined breaking points may be provided between the fixing sections and the connecting sections. This allows the connecting sections to be removed with little effort in case they are not required in a particular application of the film transducer. Yet, it is not necessary to produce different holding parts for the different cases of application.

The distance of the connecting sections from each other is greater than the width of the load application member. This ensures that the connecting sections will not obstruct the stroke of the load application member.

Preferably, the fixing sections have edges facing the composite structure, these edges having a rounded shape. The rounded edges make sure that the composite structure will not get mechanically damaged even with a great number of actuation cycles.

According to one configuration of the invention, provision is made that the holding part consists of a material having a hardness that is higher than the hardness of the deformable carrier. This prevents the forces acting during an actuation from deforming the holding part.

According to one configuration of the invention, the load application member has at least one side edge having a rounded shape. This also serves to keep the mechanical stresses on the composite structure small in the case of a great number of actuation cycles.

The film transducer may be used for converting electrical energy to mechanical work. The mechanical work is provided in the form of an actuating stroke which is executed with an actuating force.

It is also possible to use the film transducer for converting mechanical to electrical energy. In the process, the distance of the electrodes from each other will change when the load application member is moved from the outside. Similar to a charged capacitor, in which the distance of the capacitor plates from each other is changed, in the case of the film transducer the voltage between the electrodes will change. That is, the film transducer can be utilized similar to a sensor or a generator.

To prevent an electrical breakdown or a short-circuit with other components, an elastically deformable insulating layer may be provided on the electrode.

The insulating layer may be applied by chemical vapor deposition or laminated onto the electrode, for example.

It is also possible for the insulating layer to be a printed component which has been applied in particular by screen printing processes, pad printing processes or 3D printing processes.

In order not to affect the stroke of the load application member, the hardness of the insulating layer is preferably lower than the hardness of the composite structure.

Suitable materials for the insulating layer include silicone, acrylate or PU.

The holding part may be a printed component, which is preferably printed directly on the composite structure. In this way, assembly steps are saved.

The processes used for printing the holding part on may be screen printing processes, pad printing processes or 3D printing processes.

The holding part may also be an injection molded part, in particular an injection molded plastic part.

If the holding part is produced separately from the composite structure, it may be laminated onto the composite structure, so that it is reliably attached there.

The material used for the holding part may be epoxy resin, which stands out due to good insulating properties and a high mechanical and chemical stability.

Suitable conductor tracks may be integrated into the holding part, which are used for contacting the electrodes.

According to one configuration of the invention, it is provided for that the holding part includes at least one separating web by which it is connected with a neighboring holding part during the manufacturing process. The separating web is cut through, punched through or completely removed later in order to separate the holding part from the neighboring holding part. Here, a large number of holding parts may be printed, or produced in an injection mold, at the same time.

According to one configuration, provision is made that the composite structure has intrinsic sensory properties.

According to one configuration of the invention, provision is made that when there is an even number of carriers, the ratio of the area size of the electrodes and of the carriers may be approximately 1, without electrical sparkovers occurring between the outer electrode layers since in this case these are brought to the same potential upon actuation of the actuator.

BRIEF DESCRIPTION OF THE DRAWINGS

The invention will now be described below on the basis of various embodiments which are illustrated in the accompanying drawings, in which.

DETAILED DESCRIPTION OF THE INVENTION

Figure 1:
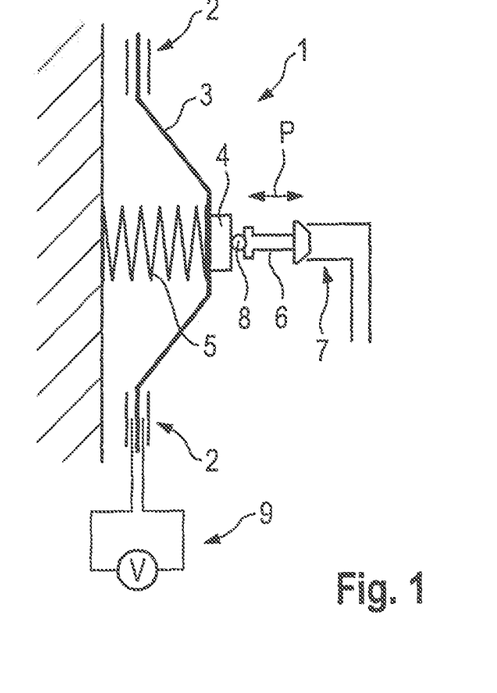
FIG. 1 schematically shows a film transducer according to the invention, which is used for converting electrical energy to mechanical work.

FIG. 1 schematically shows a film transducer 1 which includes, as essential components, a holding part 2 in which a strip-shaped, electroactive composite structure 3 is held. Mounted to the electroactive composite structure 3 is a load application member 4 inside the holding part 2.

The load application member 4 is acted on by a spring 5 on one side, and a component 6 is mounted on the opposite side, which is actuated by the film transducer 1.

In the exemplary embodiment shown, the component 6 is a valve element which cooperates with a valve seat 7. The valve element 6 can be shifted in the direction of the arrow P, so that it rests on the valve seat 7, as a result of which the valve is closed, or is lifted off the valve seat 7, as a result of which the valve is open.

A special feature resides in that the component 6 is magnetically coupled to the load application member 4. For this purpose, a magnet 8 is arranged at the component 6, and the load application member 4 is made of a ferromagnetic material or contains a ferromagnetic insert part such as, e.g., a small steel plate.

The magnet 8 may be in the form of a ball, a lens or a roll, which has the particular advantage that the component 6 is adapted to be swiveled relative to the load application member 4 in at least one direction (in the case of a roll) or in two directions (in the case of a lens or ball). This is particularly of advantage when the component 6 is not adjusted by translation, but is rotated about a swivel axis; in this case, the orientation of the component 6 changes relative to the load application member 4.

Since in the embodiment shown in FIG. 1 the film transducer operates as an actuator, it is connected to a voltage source 9.

Figure 2:
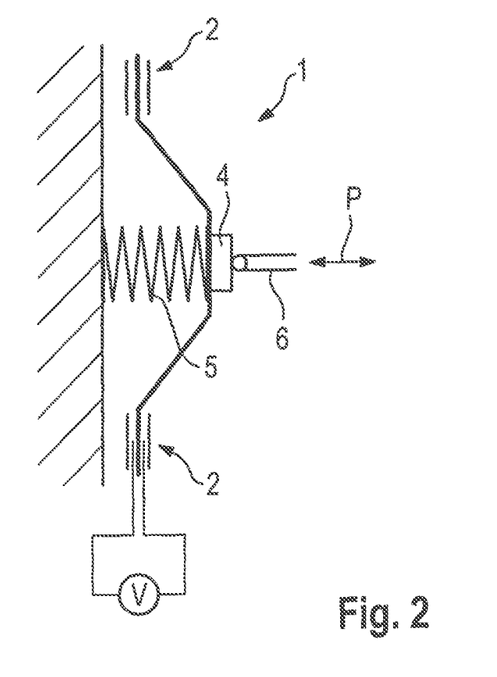
FIG. 2 schematically shows a film transducer according to the invention, which is used for converting mechanical to electrical energy.

FIG. 2 shows a second embodiment, in which the same reference numbers are used for the parts known from the first embodiment. Reference is made to the above descriptions in this regard.

The difference between the first and the second embodiment consists in that in the second embodiment, the film transducer serves to convert mechanical work (supplied by a stroke of the component 6) to electrical energy.

The structure of the film transducer 1 will now be described in detail below with reference to FIGS. 3 to 7.

The film transducer 1 includes a holding part 2 in which the electroactive composite structure 3 is held. In this embodiment, the holding part 2 is formed in the nature of a surrounding frame which is composed of two fixing sections 10 and two connecting sections 12. The two connecting sections 12 extend along the longer edges of the rectangle defined by the frame-like holding part 2, and the fixing sections extend along the shorter edges.

The holding part 2 generally has a double-layer configuration here, more specifically, it is made up of two parts 2A, 2B that are congruent to each other. But the holding part 2 may just as well be configured in one piece.

The two ends of the rectangular electroactive composite structure 3 facing away from each other are defined between the two parts 2A, 2B of the holding part, more precisely between the fixing sections 10. The electroactive composite structure 3 therefore extends in the free space between the connecting sections 12 which are arranged parallel to each other.

The electroactive composite structure 3 consists of a deformable carrier 20, which is provided with a respective electrode 22 on each of its outer surfaces (that is, the "top side" and the "bottom side").

The load application member 4 is arranged on the electroactive composite structure between the two fixing sections 10.

Preferably, the load application member 4 is arranged in the middle between the two fixing sections 10.

In the exemplary embodiment shown, the load application member 4 is in the form of a rectangular plate which is provided with an opening at the center. More specifically, the load application member 4 consists of two parts 4A, 4B, which are arranged on opposite sides of the composite structure 3. The width of the load application member 4 is somewhat smaller than the distance between the two connecting sections 12 (see the gap s remaining on each side in FIG. 5), and the length of the load application member 4 is on the order of half the distance between the fixing sections 10 (see FIG. 5). The load application member may also have a different shape, adjusted to the respective case of use. It is also possible to arrange the load application member only on one side of the composite structure 3, for example by gluing it on there.

The width of the electroactive composite structure 3 here corresponds to the width of the load application member 4 and is thus also somewhat smaller than the distance of the connecting sections 12 from each other. Its length is in the range of two to four times its width.

The edges of the holding part 2 and of the load application member 4 along which the electroactive composite structure moves upon actuation are rounded (see the chamfer 24 on the two parts 2A, 2B of the holding part 2).

The holding part 2 is produced from a comparatively rigid material, such as, e.g., epoxy resin. The strength is so high that, in view of the stresses that occur, the holding part 2 can be assumed to be a rigid frame.

The load application member 4 may also be made from a plastic material, for example an epoxy resin. The carrier 20 is a sheet or a film made from a dielectric polymer. Silicone, acrylate or PU may be used here.

The electrodes 22 which are applied to the carrier 20 consist of a mixture of a matrix material (for example, an elastomer such as silicone, acrylate or PU) which has a conductive material embedded therein (for example soot, carbon nanotubes, conductive polymers, nanowires or a mixture of these materials).

The electrodes 22 extend as far as to the regions of the fixing sections 10 where they are electrically contacted by means of contacts (not shown). These contacts are located within opening 26 provided in the two fixing sections 10.

The electrodes 22 may either extend continuously over the entire carrier, that is, from one fixing section 10 through the load application member 4 as far as to the other fixing section 10, or they may only extend starting from the fixing sections 10 as far as to the load application member 4. In the first case, it is sufficient to connect one contact on the top side and one contact on the bottom side. In the second case, provision has to be made for a respective contact on both the top side and on the bottom side in each fixing section 10.

Figure 3:
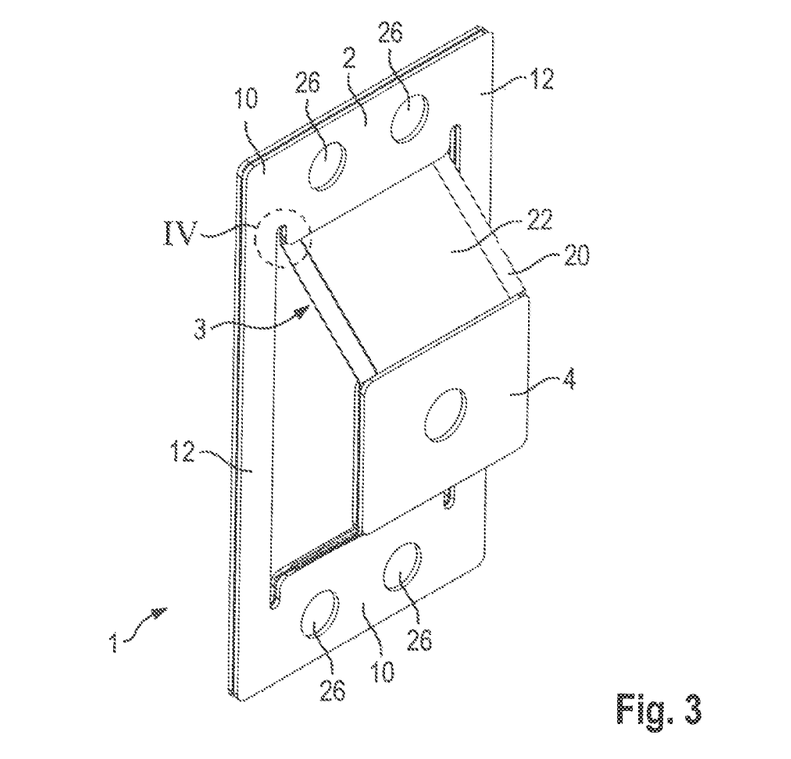
FIG. 3 shows an exemplary embodiment of a film transducer according to the invention in a perspective schematic view.
Figure 4:
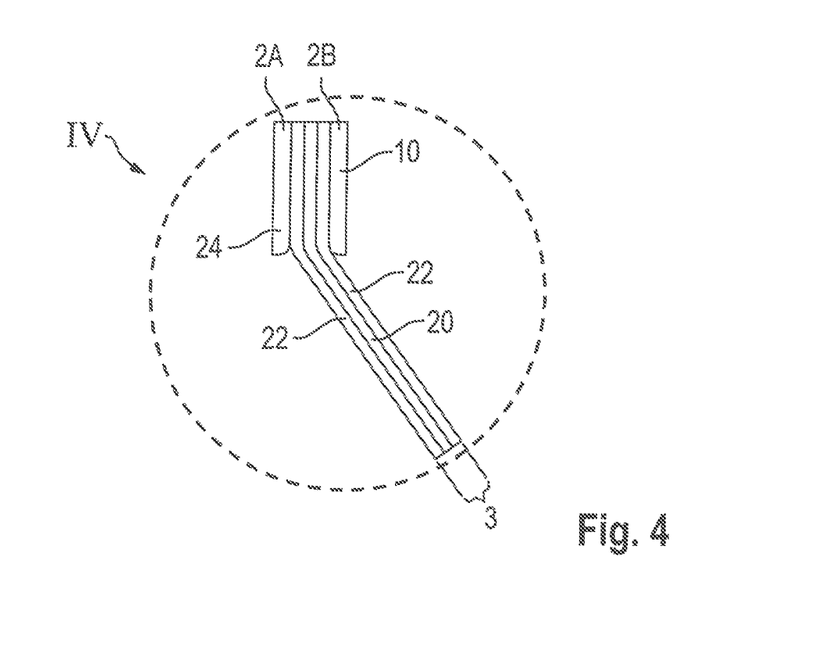
FIG. 4 shows the detail IV of FIG. 3 in an enlarged side view.

In the exemplary embodiment shown, the electrodes 22 do not extend as far as to the edge of the carrier 20 (see FIG. 3). However, it is basically also possible for the electrodes 22 to cover the entire section of the carrier 20.

When a suitable electrical field is applied to the electrodes 22, the electrodes 22 are urged toward each other, causing the carrier 20 to be elastically pressed together. Since the carrier 20 is made of a substantially incompressible material, it becomes longer (together with the electrodes). In the exemplary embodiment of FIG. 1, this results in the spring 5 being enabled to shift the load application member 4 to the right and thereby to close the valve.

When the electrical field is removed again, the carrier 20 will become shorter, so that the spring 5 is compressed and the valve is opened.

The holding part 2 may be adhesively bonded to the electroactive composite structure 3. It is also possible to form the holding part 2 as a printed component which is printed onto the electroactive composite structure.

The same is true for the load application member 4.

The electrodes 22 of the electroactive composite structure may also be printed onto the carrier.

In the exemplary embodiment shown, the electroactive composite structure contains a carrier with two electrodes. A stacked composite structure may also be used, in which a plurality of electrodes alternate with a plurality of carriers. In this case, preferably all odd-numbered electrodes are plated through jointly, so that they are at a first potential when driven, and all even-numbered electrodes are plated through, so that they are at a second potential.

Figure 8:
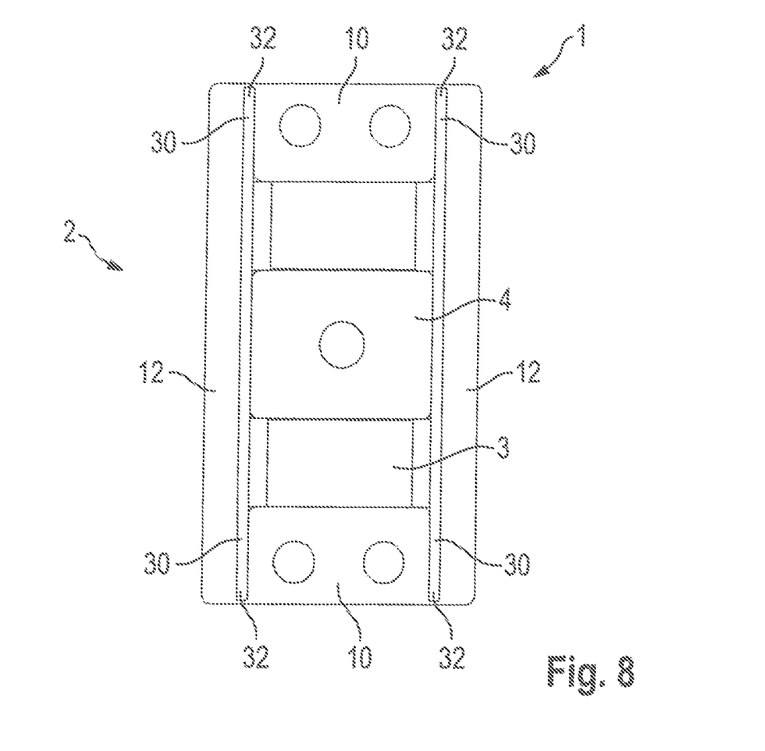
FIG. 8 shows a top view of a second embodiment of a film transducer according to the invention.

The embodiment shown in FIG. 8 differs from the first embodiment in that a slot 30 is provided between the fixing sections 10 and the connecting sections 12 that are arranged laterally thereof, the slot 30 extending to just before the outer edge of the holding part 2. As a result, the connecting sections 12 are connected with the fixing sections 10 only by very thin material webs 32, which act as predetermined breaking points. This allows the connecting sections 12 to be removed with little effort and without a tool in case they are not necessary or disturbing in a particular case of application. In this case, the holding part 2 consists of the two fixing sections 10, which are no longer directly connected with each other, but only indirectly by means of the electroactive composite structure 3 extending between them. In that case, however, it is necessary to fasten the fixing sections 10 to a base part at a distance from each other.

Figure 9:
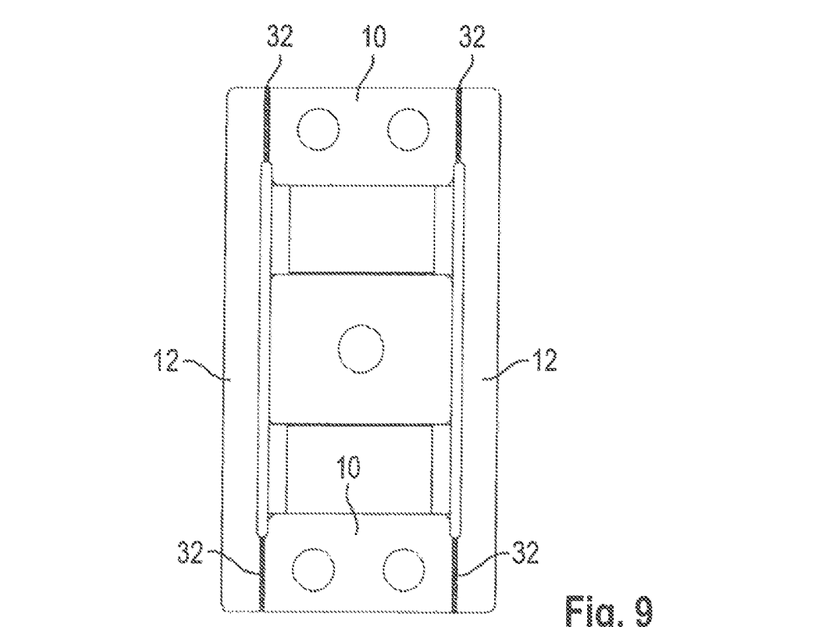
FIG. 9 shows a top view of a third embodiment of a film transducer according to the invention.

Similar to the second embodiment of FIG. 8, in the exemplary embodiment of FIG. 9, predetermined breaking points are provided between the fixing sections 10 of the holding part 2 and the connecting sections 12. Here, the predetermined breaking points 32 are in the form of sections of reduced wall thickness of the two parts 2A, 2B of the holding part 2, that is, in the form of grooves. This also allows the connecting sections 12 to be quickly removed if required.

Figure 5:
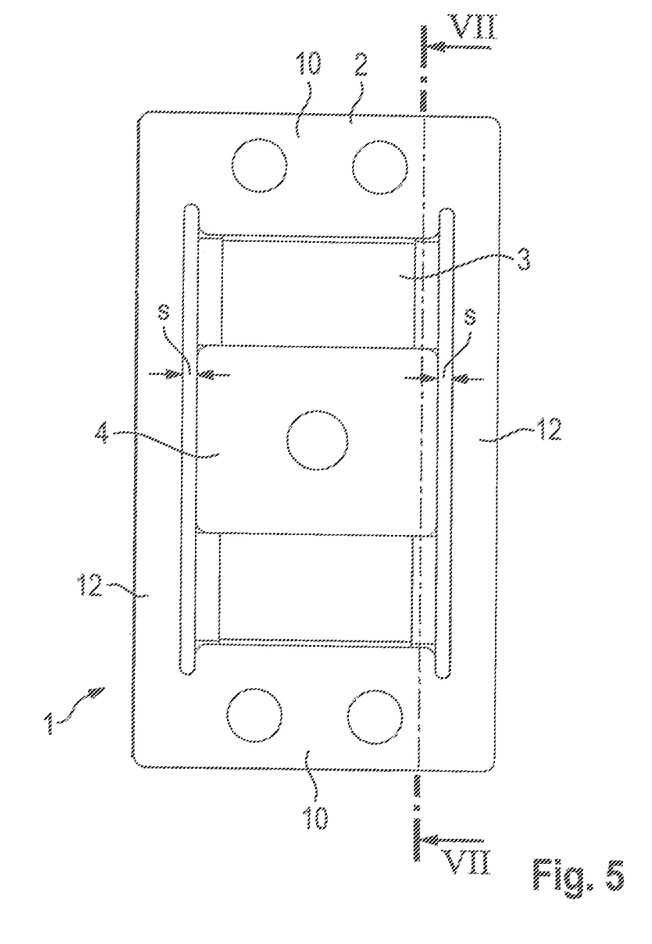
FIG. 5 shows a top view of the film transducer of FIG. 3.
Figure 6:
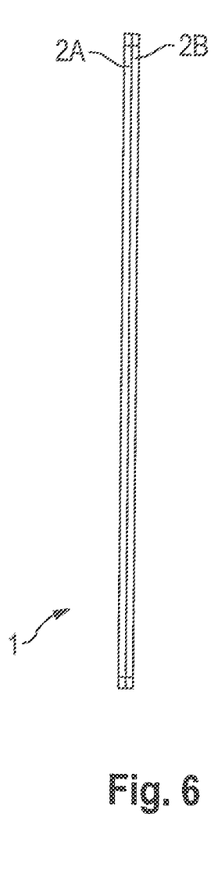
FIG. 6 shows a side view of the film transducer of FIG. 5 when a load application member is located in the same plane as the holding part.
Figure 7:
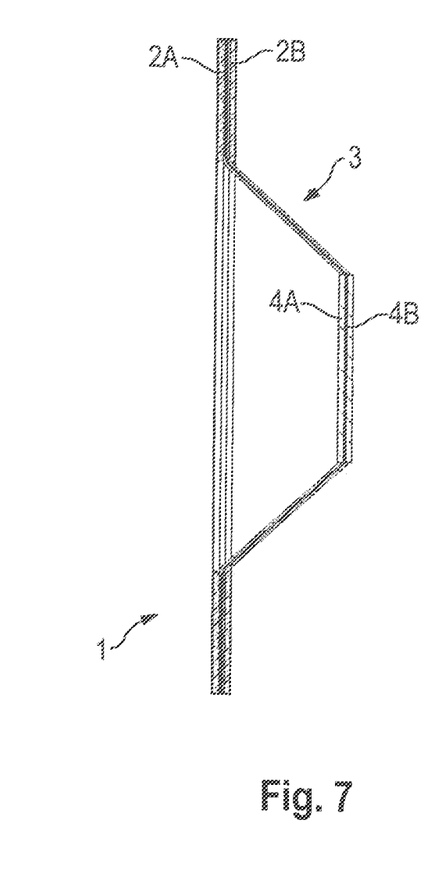
FIG. 7 shows a section taken along the plane VII-VII of FIG. 5, with the load application member being lengthened in comparison with the illustration of FIG. 6.
Figure 10:
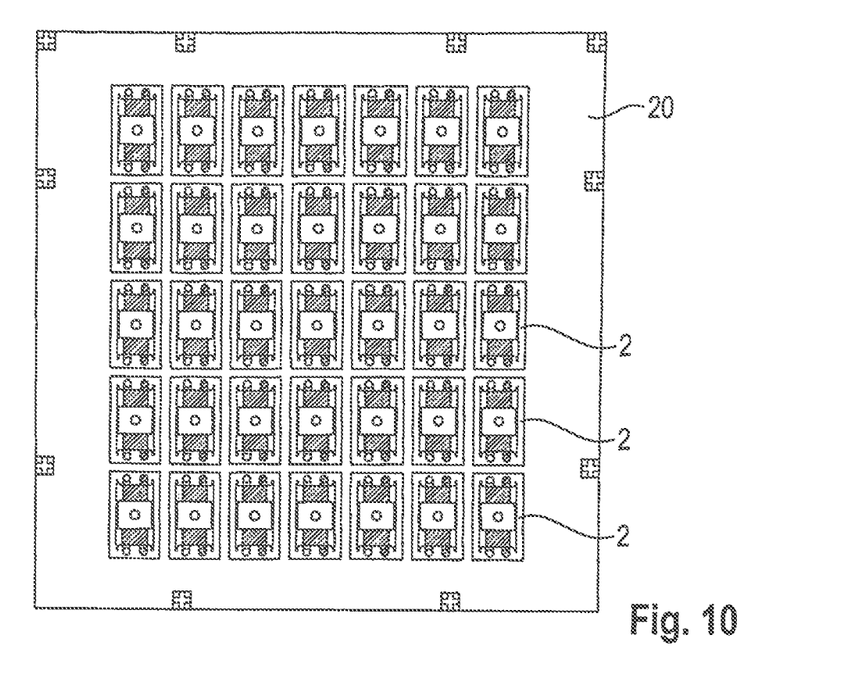
FIG. 10 shows a top view of a carrier which contains a multitude of film transducers according to the invention.

FIG. 10 illustrates a carrier 20 (that is, the flexible film) having a larger-area configuration as compared with that of FIG. 5. Arranged on the carrier 20 is a multitude of film transducers 1 located side by side and one below the other in the nature of a matrix structure. The holding parts 2 and the load application members 4 may be applied onto the carrier 20 by means of screen printing processes, pad printing processes or 3D printing processes, for example.

Figure 11:
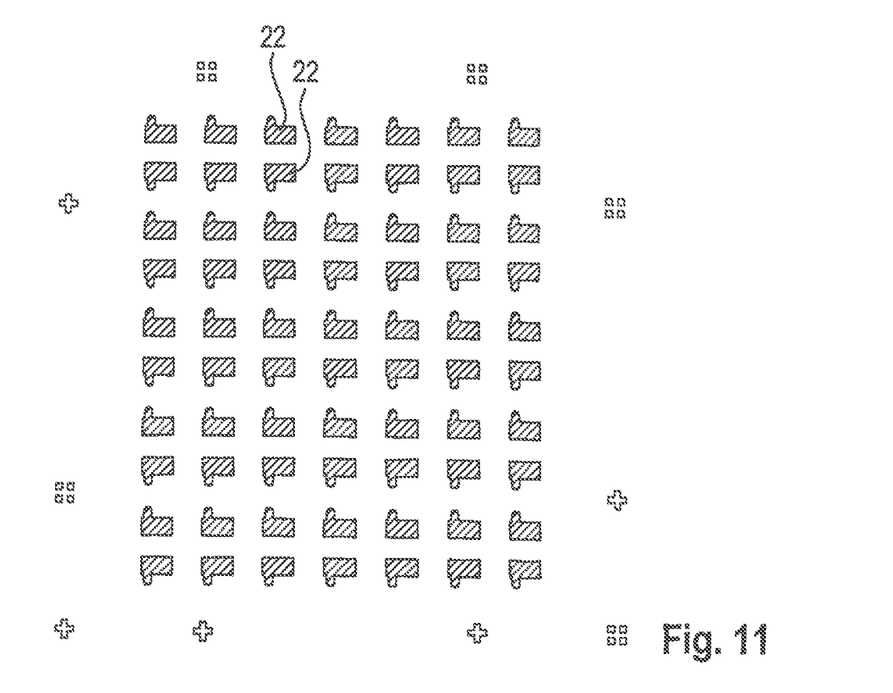
FIG. 11 shows a top view of a matrix including electrodes that are adapted for use in the carrier of FIG. 10.

At the same time, a multitude of electrodes 22 (see FIG. 11) may also be applied in a pattern suitable for the contacting. This may also be suitably effected by a printing process.

After the electroactive composite structures have been applied and the holding parts completed, the individual film transducers formed in this way can be separated from the large-area carrier 20 by being punched out, for example.

Figure 12:
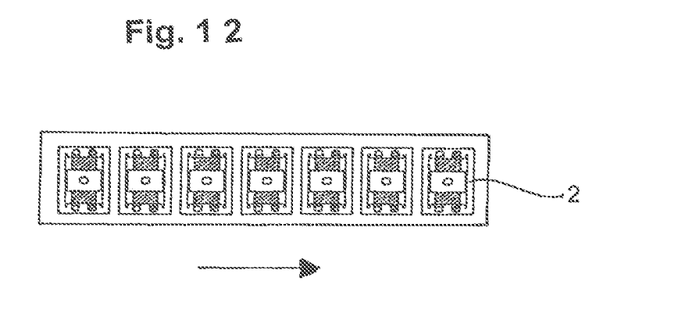
FIG. 12 shows a top view of a strip of film transducers arranged side by side.
Figure 13:
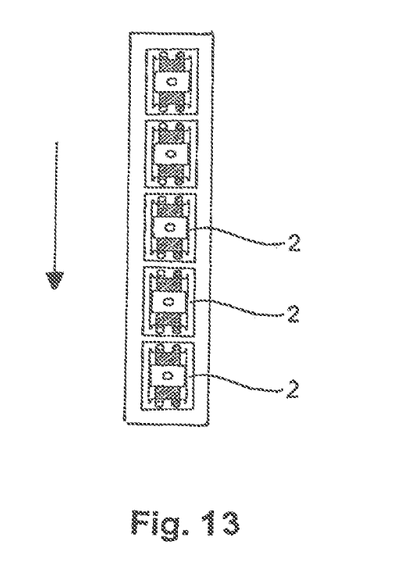
FIG. 13 shows a top view of a strip of film transducers arranged one below the other.

Alternatively, proceeding from FIG. 10, a plurality of strips having a plurality of film transducers 1 located side by side (FIG. 12) or located one below the other (FIG. 13) can be cut out. By an accordion folding of these strips in the direction of the arrow, a stacked composite structure is obtained, which is made up of a plurality of film transducers 1 positioned on top of each other and in which a plurality of electrodes alternate with a plurality of carriers, as described above.

Particular embodiments of the invention further provide a digital storage medium comprising a 3D model, adapted to be read out, of the composite structure as is used in a film transducer according to the invention, the 3D model being adapted to cooperate with a programmable computer system and a 3D printer such that the composite structure is produced.

Another particular embodiment provides a digital storage medium comprising a 3D model, adapted to be read out, of the holding part as is used in a film transducer according to the present invention, the 3D model being adapted to cooperate with a programmable computer system and a 3D printer such that the holding part is produced.

Another particular embodiment provides a digital storage medium comprising a 3D model, adapted to be read out, of the film transducer of the present invention, the 3D model being adapted to cooperate with a programmable computer system and a 3D printer such that the film transducer is produced.

What is claimed:

1. A film transducer comprising a holding part, an electroactive composite structure including at least two deformable carriers and at least two electrodes arranged on opposite sides of said deformable carriers, said composite structure having two opposite ends facing away from each other, and a load application member mounted to said composite structure, said holding part engaging said ends of said composite structure, said load application member being arranged between said ends of said composite structure wherein said composite structure includes two or more deformable carriers stacked one on top of another, said electrodes are plated through in an area of said holding part by using a first electrode to jointly contact a first set of electrodes and a second electrode to jointly contact a second set of electrodes, wherein said load application member has a magnet assigned to it by which the load application member can be coupled to a further component, for example a valve element, by magnetic forces of attraction.

2. The film transducer of claim 1 wherein a spring element is provided which urges said load application member in one direction.

3. The film transducer of claim 1 comprising a folded sequence of carrier sections with electrodes.

4. The film transducer of claim 1 wherein said composite structure has a rectangular basic shape.

5. The film transducer of claim 1 wherein said carrier is a dielectric material.

6. The film transducer of claim 5 wherein said carrier is a sheet or a film made from a dielectric polymer.

7. The film transducer of claim 5 wherein said carrier is a printed component which has been produced as a thin film by screen printing processes, pad printing processes, 3D printing processes.

8. The film transducer of claim 5 wherein said carrier is a cast component.

9. The film transducer of claim 1 wherein said electrodes are a printed component which has been applied as a thin layer by screen printing processes, pad printing processes, 3D printing processes, lamination, inkjet printing processes or aerosol jet processes.

10. The film transducer of claim 1 wherein said electrode is bonded to the carrier.

11. The film transducer of claim 1 wherein said electrode is configured to be continuous on one side of said carrier.

12. The film transducer of claim 1 wherein said electrode consists of two separate electrode sections on one side of said carrier.

13. The film transducer of claim 1 wherein said composite structure has an elongated, rectangular basic shape and said holding part engages at two sides of said composite structure which are shorter than two other sides.

14. The film transducer of claim 1 wherein said holding part consists of two fixing sections each of which is arranged at one of said ends of said composite structure.

15. The film transducer of claim 14 wherein said two fixing sections are connected to each other by connecting sections.

16. The film transducer of claim 15 wherein predetermined breaking points in the form of thin material webs or areas of reduced wall thickness are provided between the fixing sections and the connecting sections.

17. The film transducer of claim 15 wherein a distance of said connecting sections from each other is greater than a width of said load application member.

18. The film transducer of claim 14 wherein said fixing sections are connected to each other only indirectly by means of said composite structure.

19. The film transducer of claim 14 wherein said fixing sections are provided with fastening openings.

20. The film transducer of claim 14 wherein said fixing sections have edges facing said composite structure, said edges having a rounded shape.

21. The film transducer of claim 1 wherein said holding part consists of a material having a hardness that is higher than a hardness of said deformable carrier.

22. The film transducer of claim 1 wherein said load application member has at least one side edge having a rounded shape.

23. The film transducer of claim 1 wherein an elastically deformable insulating layer is applied to the electrode.

24. The film transducer of claim 1 wherein said insulating layer has been applied by chemical vapor deposition.

25. The film transducer of claim 24 wherein said insulating layer is laminated on the electrode.

26. The film transducer of claim 25 wherein said insulating layer is a printed component which has been applied by screen printing processes, pad printing processes or 3D printing processes.

27. The film transducer of claim 24 wherein said insulating layer has a hardness that is lower than a hardness of said composite structure.

28. The film transducer according to claim 23, characterized in that the insulating layer is made from silicone, acrylate or polyurethane.

29. The film transducer of claim 1 wherein said holding part is a printed component.

30. The film transducer of claim 1 wherein said holding part is printed on said composite structure.

31. The film transducer of claim 1 wherein said holding part has been printed by screen printing processes, pad printing processes or 3D printing processes.

32. The film transducer of claim 1 wherein said holding part is an injection molded part.

33. The film transducer of claim 1 wherein said holding part is laminated on the composite structure.

34. The film transducer of claim 1 wherein said holding part consists of an epoxy resin.

35. The film transducer of claim 1 wherein said holding part is provided with conductor tracks.

36. The film transducer of claim 1 wherein said holding part includes at least one separating web by which it is connected with a neighboring holding part during the manufacturing process.

37. The film transducer of claim 1 wherein said composite structure has intrinsic sensory properties.

38. The film transducer of claim 1 wherein when there is an even number of said carriers, wherein the electrodes have an area size and said carriers have an area size, the area sizes having a ratio electrode area size to carrier area size of approximately 1 to prevent electrical sparkovers.

* * * * *